(12) United States Patent
Chen et al.

(10) Patent No.: US 12,074,115 B2
(45) Date of Patent: Aug. 27, 2024

(54) HEAT DISSIPATION-ELECTROMAGNETIC SHIELDING EMBEDDED PACKAGING STRUCTURE, MANUFACTURING METHOD THEREOF, AND SUBSTRATE

(71) Applicant: Zhuhai ACCESS Semiconductor Co., Ltd, Zhuhai (CN)

(72) Inventors: Xianming Chen, Zhuhai (CN); Bingsen Xie, Zhuhai (CN); Benxia Huang, Zhuhai (CN); Lei Feng, Zhuhai (CN)

(73) Assignee: ZHUHAI ACCESS SEMICONDUCTOR CO., LTD, Zhuhai (CN)

( * ) Notice: Subject to any disclaimer, the term of this patent is extended or adjusted under 35 U.S.C. 154(b) by 483 days.

(21) Appl. No.: 17/428,822

(22) PCT Filed: Jul. 24, 2020

(86) PCT No.: PCT/CN2020/104571
§ 371 (c)(1),
(2) Date: Aug. 5, 2021

(87) PCT Pub. No.: WO2021/253573
PCT Pub. Date: Dec. 23, 2021

(65) Prior Publication Data
US 2022/0310529 A1 Sep. 29, 2022

(30) Foreign Application Priority Data
Jun. 16, 2020 (CN) .......................... 202010546032.7

(51) Int. Cl.
*H01L 23/552* (2006.01)
*H01L 21/48* (2006.01)
*H01L 23/373* (2006.01)

(52) U.S. Cl.
CPC ........ *H01L 23/552* (2013.01); *H01L 21/4871* (2013.01); *H01L 23/3735* (2013.01)

(58) Field of Classification Search
CPC .............. H01L 23/552; H01L 23/3735; H01L 21/4871
See application file for complete search history.

(56) References Cited

U.S. PATENT DOCUMENTS

| 9,911,700 B2 | 3/2018 | Hurwitz et al. |
| 10,062,663 B2 | 8/2018 | Lin et al. |

(Continued)

FOREIGN PATENT DOCUMENTS

| CN | 104505386 A | 12/2014 |
| CN | 104269384 A | 1/2015 |

(Continued)

OTHER PUBLICATIONS

Written Opinion of the International Search Authority of International Application No. PCT/CN2020/104571, mailed Mar. 17, 2021, 6 pages, Last 2 pages being an English translation.

(Continued)

*Primary Examiner* — Christine A Enad
(74) *Attorney, Agent, or Firm* — Grossman, Tucker, Perreault & Pfleger, PLLC; Paul J. Kroon, Jr.

(57) ABSTRACT

Disclosed are a heat dissipation-electromagnetic shielding embedded packaging structure, a manufacturing method thereof, and a substrate. The heat dissipation-electromagnetic shielding embedded packaging structure includes: a dielectric layer including an upper surface and a lower surface, wherein at least one hollow cavity unit is disposed inside the dielectric layer; an insulating layer disposed in the hollow cavity unit, wherein the hollow cavity unit is partially filled with the insulating layer; an electronic element, wherein one end is embedded in the insulating layer, the other end is exposed in the hollow cavity unit, and the (Continued)

electronic element includes terminals; a through hole penetrating through the upper surface and the lower surface of the dielectric layer and communicating with the terminals; and a metal layer covering the six surfaces of the dielectric layer and the interior of the through hole to form a shielding layer and circuit layer respectively.

10 Claims, 5 Drawing Sheets

(56) References Cited

U.S. PATENT DOCUMENTS

| | | | |
|---|---|---|---|
| 10,553,542 | B2 | 2/2020 | Shin et al. |
| 2015/0279814 | A1 | 10/2015 | Hurwitz et al. |
| 2017/0162556 | A1 | 6/2017 | Lin et al. |
| 2017/0213793 | A1* | 7/2017 | Hurwitz .............. H01L 23/5389 |
| 2018/0053732 | A1 | 2/2018 | Baek et al. |
| 2018/0197831 | A1* | 7/2018 | Kim ........................ H01L 23/13 |
| 2019/0051612 | A1 | 2/2019 | Kim et al. |
| 2020/0205280 | A1* | 6/2020 | Lee ...................... H05K 3/4644 |
| 2021/0233826 | A1* | 7/2021 | Park ................... H01L 23/3735 |

FOREIGN PATENT DOCUMENTS

| | | |
|---|---|---|
| CN | 106057745 A | 10/2016 |
| CN | 106997870 A | 8/2017 |
| IN | 108305868 A | 7/2018 |
| KR | 20170089397 A | 8/2017 |
| KR | 20180020849 A | 2/2018 |

OTHER PUBLICATIONS

International Search Report of International Application No. PCT/CN2020/104571, mailed Mar. 17, 2021, 6 pages, Last 2 pages being an English translation.
Office Action for Chinese Application No. CN202010546032.7, dated Apr. 12, 2021, 20 pages, Last 11 pages being an English translation.
Office Action for Chinese Application No. CN202010546032.7, dated Jul. 1, 2021, 13 pages, Last 6 pages being an English translation.
Office Action (Decision of Rejection) from related Chinese Application No. 202010546032.7, dated Sep. 18, 2021. English translation attached. 8 pages.
Office Action (3rd Office Action) from related Chinese Application No. 202010546032.7, dated Feb. 25, 2022. English translation attached. 7 pages.
Written Opinion from related Japanese Application No. 2021-545754, dated Jan. 13, 2023. English translation attached. 6 pages.
Office Action (Notice of Final Rejection) from related Korean Application No. 10-2021-7024192, dated Apr. 4, 2023. English translation attached. 10 pages.
Request for Submission of an Opinion from related Korean Application No. 10-2021-7024192, dated Oct. 1, 2022. English translation attached. 11 pages.

* cited by examiner

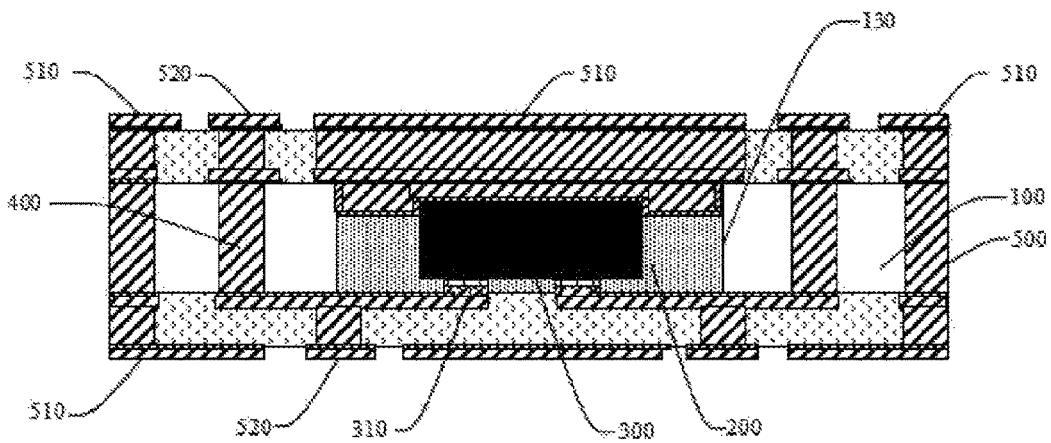

FIG. 1

| provide a first dielectric layer having a through hole and a hollow cavity unit, a metal layer covers the surrounding surface of the first dielectric layer and the interior of the through hole | S100 |

↓

| dispose an insulating layer in the hollow cavity unit, mount an electronic element to a bottom of the insulating layer, and cure and photoetching the insulating layer to expose terminals of the electronic element, the upper end of the electronic element is exposed out of the insulating layer | S200 |

↓

| form a first metal layer on an upper surface and a lower surface of the first dielectric layer, and photoetching the first metal layer to form a first circuit layer and a first shielding layer, the first circuit layer communicates with the terminals and the through hole; and the first shielding layer communicates with the metal layer on the surrounding surface of the first dielectric layer | S300 |

FIG. 2

HEAT DISSIPATION-ELECTROMAGNETIC SHIELDING EMBEDDED PACKAGING STRUCTURE, MANUFACTURING METHOD THEREOF, AND SUBSTRATE

CROSS-REFERENCE TO RELATED APPLICATIONS

This application is a national stage filing under 35 U.S.C. § 371 of international application number PCT/CN2020/104571, filed Jul. 24, 2020, which claims priority to Chinese patent application No. 2020105460327 filed Jun. 16, 2020, the entire content of each of which is incorporated herein by reference.

TECHNICAL FIELD

The present application relates to the field of semiconductor packaging technology, and more particularly, to a heat dissipation-electromagnetic shielding embedded packaging structure, a manufacturing method thereof, and a substrate.

BACKGROUND

The volumes of electronic products are becoming thinner and thinner, the degree of integration is increasingly improved, and the embedded packaging technology is getting more and more popular. However, with the increase of the degree of integration and the improvement of computing power, the requirement for heat dissipation and electromagnetic interference resistance of packages is becoming higher and higher.

Currently, in the market, heat dissipation is mostly achieved by connecting copper pillars to one surface of an electronic element, while electromagnetic interference resistance is mostly achieved by using a metal packaging shell outside a substrate. Moreover, for the existing packaging technology, the functions of heat dissipation and electromagnetic interference resistance cannot be both taken into account in a design in.

SUMMARY

The present application aims to address one of the technical problems in the related art at least to a certain extent. To this end, the present application proposes a heat dissipation-electromagnetic shielding embedded packaging structure, a manufacturing method thereof, and a substrate. The summary of the theme is described in detail hereinafter. The summary is not intended to limit the protection scope of the claims. The technical scheme is as follows:

In a first aspect, the embodiments of the present application provide a heat dissipation-electromagnetic shielding embedded packaging structure, including:
  a dielectric layer including an upper surface and a lower surface, wherein at least one hollow cavity unit is disposed inside the dielectric layer;
  an insulating layer disposed in the hollow cavity unit, wherein the hollow cavity unit is partially filled with the insulating layer;
  an electronic element, wherein one end is embedded in the insulating layer, the other end is exposed in the hollow cavity unit, and the electronic element includes terminals;
  a through hole penetrating through the upper surface and the lower surface of the dielectric layer and communicating with the terminal; and
  a metal layer covering the six surfaces of the dielectric layer and the interior of the through hole to form shielding a layer and a circuit layer respectively, wherein the shielding layer covers the exposed end of the electronic element, and the shielding layer and the circuit layer are isolated by the dielectric layer.

The heat dissipation-electromagnetic shielding embedded packaging structure according to the embodiments of the first aspect of the present application at least has the following beneficial effects: in the first aspect, by forming the shielding layer on the six surfaces of the dielectric layer, an effect of omnidirectional electromagnetic radiation resistance is achieved; and in the second aspect, since the through hole communicates with the terminals of the electronic element and leads to the circuit layer on the upper surface and the lower surface, efficient heat dissipation is achieved. It should be noted that the shielding layer located on the reverse side of the terminals of the electronic element can achieve not only an electromagnetic shielding function but also a heat dissipation function.

Optionally, in one embodiment of the present application, at least one dielectric layer is included, and the surface of each dielectric layer is provided with a circuit layer.

Optionally, in one embodiment of the present application, the shielding layer covering the exposed end of the electronic element can also communicate with the shielding layer covering the surface of the dielectric layer via a through hole.

Optionally, in one embodiment of the present application, the metal layer includes a seed layer and a covering layer, and the seed layer is disposed at the bottom of the covering layer.

Optionally, in one embodiment of the present application, the insulating layer is made of a liquid photosensitive dielectric material, which can be cured at a high temperature.

In a second aspect, the embodiments of the present application provide a manufacturing method of a heat dissipation-electromagnetic shielding embedded packaging structure, including:
  providing a first dielectric layer having a through hole and a hollow cavity unit, wherein metal layer cover the surrounding surface of the first dielectric layer and the interior of the through hole;
  disposing an insulating layer in the hollow cavity unit, mounting an electronic element to the bottom of the insulating layer, and curing and photoetching the insulating layer to expose the terminals of the electronic element, wherein the upper end of the electronic element is exposed out of the insulating layer; and
  forming a first metal layer on an upper surface and a lower surface of the first dielectric layer, and photoetching the first metal layer to form a first circuit layer and a first shielding layer, wherein the first circuit layer communicates with the terminals and the through hole; and the first shielding layer communicates with the metal layer on the surrounding surface of the first dielectric layer.

The manufacturing method of the heat dissipation-electromagnetic shielding embedded packaging structure according to the embodiments of the second aspect of the present application at least has the following beneficial effects: in the first aspect, by forming the shielding layers on the six surfaces of the dielectric layer, an effect of omnidirectional electromagnetic radiation resistance is achieved;

and in the second aspect, by connecting the terminals of the electronic element to the circuit layers on the upper surface and the lower surface, efficient heat dissipation is achieved. It should be noted that the shielding layer located on the reverse side of the terminals of the electronic element can achieve not only an electromagnetic shielding function but also a heat dissipation function.

Optionally, in one embodiment of the present application, the step of disposing the insulating layer in the hollow cavity unit, mounting the electronic element to the bottom of the insulating layer, and curing and photoetching the insulating layer to expose the terminals of the electronic element further includes:

laminating an adhesive tape on the lower surface of the first dielectric layer;

filling a fixed amount of photosensitive liquid dielectric material into the hollow cavity unit to form the insulating layer;

mounting the electronic element to the bottom of the insulating layer;

pre-curing the insulating layer;

removing the adhesive tape; and curing the insulating layer at a high temperature and photoetching the insulating layer to expose the terminals of the electronic element.

Optionally, in one embodiment of the present application, the step of forming the first metal layer includes:

forming a seed layer on the upper surface of the first dielectric layer, wherein the seed layer is made of a metal and/or metal alloy material; and forming a covering layer on the surface of the seed layer, wherein the covering layer is made of a metal material with a certain thickness.

Optionally, in one embodiment of the present application, the method further includes:

forming an (N+1)th dielectric layer on the surface of the Nth metal layer, and performing photoetching and electroplating on the (N+1)th dielectric layer to form an (N+1)th metal layer; and photoetching the (N+1)th metal layer to form an (N+1)th circuit layer and an (N+1)th shielding layer, wherein the first circuit layer, . . . and the (N+1)th circuit layer communicate with the through hole, and the first shielding layer, . . . and the (N+1)th shielding layer communicate with the metal layer on the surrounding surface of the dielectric layer, wherein N≥1

Optionally, in one embodiment of the present application, the first shielding layer and the (N+1)th shielding layer communicate with the metal layer on the surrounding surface of the dielectric layer, wherein the first shielding layer communicates with the (N+1)th shielding layer in at least one of the following ways:

completely etching away the (N+1)th dielectric layer corresponding to the upper surface of the hollow cavity unit, and filling a metal so that the first shielding layer is seamlessly connected with the (N+1)th shielding layer through the metal; and partially etching away the (N+1)th dielectric layer corresponding to the upper surface of the hollow cavity unit to form a through hole window, and filling a metal so that the first shielding layer communicates with the (N+1)th shielding layer via a through hole.

In a third aspect, the embodiments of the present application provide a substrate, including the heat dissipation-electromagnetic shielding embedded packaging structure as described in the first aspect.

The substrate according to the embodiments of the third aspect of the present application at least has the following beneficial effects: in the first aspect, by forming the shielding layers on the six surfaces of the substrate, an effect of omnidirectional electromagnetic radiation resistance is achieved; and in the second aspect, since the through hole inside the substrate communicates with the terminals of the electronic element and leads to the circuit layers on the upper surface and the lower surface, efficient heat dissipation is achieved. It should be noted that the shielding layer located on the reverse side of the terminals of the electronic element can achieve not only an electromagnetic shielding function but also has heat dissipation function.

Other features and advantages of the present application will be described in the following specification, and will become obvious partially from the specification, or be understood by implementing the present application. The object and other advantages of the present application can be achieved and obtained through the structures specified in the specification, the claims and the drawings.

BRIEF DESCRIPTION OF DRAWINGS

The drawings are intended to provide a further understanding of the technical schemes of the present application, and constitute a part of the specification. The drawings are intended to explain the technical schemes of the present application together with the embodiments of the present application rather than constitute a limitation to the technical schemes of the present application.

FIG. 1 is a sectional view of a heat dissipation-electromagnetic shielding embedded packaging structure provided by one embodiment of the present application;

FIG. 2 is a flow chart of steps of a manufacturing method of a heat dissipation-electromagnetic shielding embedded packaging structure provided by another embodiment of the present application;

Figure 3:
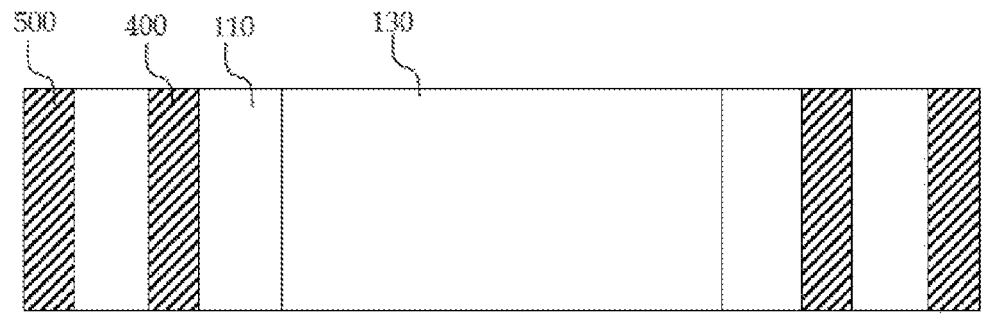
FIG. 3 is a sectional view corresponding to step S100 in the manufacturing method of the heat dissipation-electromagnetic shielding embedded packaging structure provided by the other embodiment of the present application.

Dielectric layer 100, first dielectric layer 110, second dielectric layer 120, hollow cavity unit 130, insulating layer 200, electronic element 300, terminal 310, through hole 400, metal layer 500, first metal layer 501, second metal layer 502, shielding layer 510, first shielding layer 511, second shielding layer 512, circuit layer 520, first circuit layer 521, second circuit layer 522, seed layer 530, covering layer 540, adhesive tape 600, solder mask window 700

DETAILED DESCRIPTION

In order to make the object, technical schemes and advantages of the present application clearer, the present application will be further described in detail below with reference to the drawings and embodiments. It should be understood that the specific embodiments described herein are merely intended to explain the present application rather than limit the present application, so they have no technically substantive significance. Any structural modification, proportional relationship change, or size adjustment shall still fall within the scope covered by the technical content disclosed by the present application, without affecting the efficacy and object that can be achieved by the present application.

This section will describe the specific embodiments of the present application in detail. The preferred embodiments of the present application are shown in the drawings. The purpose of the drawings is to supplement the description of the text of the specification with graphics, so that people can visually understand each technical feature and overall technical scheme of the present application. However, the drawings cannot be understood as a limitation to the protection scope of the present application.

In the description of the present application, "a plurality of" means one or more, while "multiple" means two or more. "greater than", "less than", "exceed" and the like should be understood as excluding this number, while "more than", "less than", "within" and the like should be understood as including this number. If described, "first" and "second" are merely intended to distinguish technical features rather than be understood as indicating or implying relative importance or implicitly indicating the number of indicated technical features or implicitly indicating the precedence relationship of the indicated technical features.

Referring to FIG. 1, the present application provides a heat dissipation-electromagnetic shielding embedded packaging structure, including: a dielectric layer 100 including an upper surface and a lower surface, wherein at least one hollow cavity unit 130 is disposed inside the dielectric layer 100; an insulating layer 200 disposed in the hollow cavity unit 130, wherein the hollow cavity unit 130 is partially filled with the insulating layer 200; an electronic element 300, wherein one end is embedded in the insulating layer 200, the other end is exposed in the hollow cavity unit 130, and the electronic element 300 includes terminals 310; a through hole 400 penetrating through the upper surface and the lower surface of the dielectric layer 100 and communicating with the terminal 310; and a metal layer 500 covering the six surfaces of the dielectric layer 100 and the interior of the through hole 400 to form shielding layers 510 and circuit layers 520 respectively, wherein the shielding layer 510 covers the exposed end of the electronic element 300, and the shielding layer 510 and the circuit layer 520 are isolated by the dielectric layer 100.

In one embodiment, one or more hollow cavity units 130 are disposed inside the dielectric layer 100, and the hollow cavity units 130 may or may not be arranged in an array, and are disposed according to the required number of the electronic element 300. After the hollow cavity unit 130 is formed, the insulating layer 200 is filled. The hollow cavity unit 130 is not completely filled with the insulating layer 200, but a certain space is reserved for holding the electronic element 300 and covering it with a metal. The electronic element 300 is divided into a front side and a reverse side according to whether there are terminals 310, with the front side with the terminal 310 being placed at the bottom of the insulating layer 200 and close to the lower surface of the hollow cavity unit 130 and the reverse side being exposed on the insulating layer 200. The metal layer 500 include the shielding layers 510 and the circuit layers 520, the shielding layers 510 cover the periphery and upper and lower six surfaces of the dielectric layer 100 as well as the upper part of the reverse side of the electronic element 300, and an effect of omnidirectional electromagnetic radiation resistance can be achieved by disposing the shielding layers 510. In addition, the through hole 400 is formed in the dielectric layer 100, and the through hole 400 communicates with the terminals 310 of the electronic element 300 and extends to the circuit layers 520 on the upper surface and the lower surface of the dielectric layer 100. Compared with the single-side heat dissipation technology for the electronic element 300, the heat dissipation mode of making the through hole 400 communicate with the circuit layers 520 on the upper surface and the lower surface of the dielectric layer 100 increases the heat dissipation area of the electronic element 300, improving the efficiency of heat dissipation, and furthermore, the shielding layer 510 covering the reverse side of the electronic element 300 also has a heat dissipation function, further increasing the efficiency of heat dissipation of the electronic element 300. Furthermore, the hollow cavity unit 130 is pre-filled with the material of the insulating layer 200 without performing a lamination and thinning process after mounting, thus greatly shortening the production cycle and reducing the production cost, the usage of materials and environmental pollution.

It should be noted that the electronic element 300 includes, but is not limited to, devices and chips. The electronic element may be an active device or a passive device, an independent chip or device, a combination of multiple chips or devices, different power devices according to functional classification or radio frequency or logic chips. The type and number of chips or devices may be designed based on a combination of multiple chips stacked back to back three-dimensionally or a combination of upper, lower, left and right single-layer arrays. The electronic element 300 may be mounted with the front side downward in the hollow cavity unit 130, and communicates with the circuit layer 520 on the lower surface for conduction and heat dissipation. The electronic element 300 may also be mounted with the reverse side in the hollow cavity unit 130, and at this point, the terminals 310 can communicate with the circuit layer 520 disposed on the upper surface upward for conduction and heat dissipation. The specific mounting direction of the electronic element 310 may be set according to design requirements, and shall fall within the protection scope of the present application.

Figure 14:
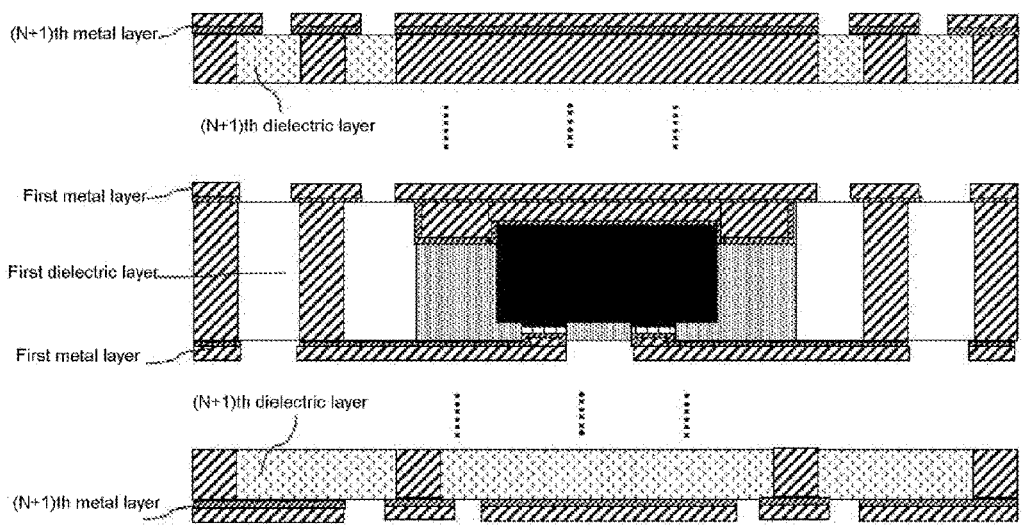
FIG. 14 is a sectional view of a heat dissipation-electromagnetic shielding embedded packaging structure provided by another embodiment of the present application.

Referring to FIG. 14, one embodiment of the present application provides a heat dissipation-electromagnetic shielding embedded packaging structure. At least one dielectric layer 100 is included, and the surface of each dielectric layer 400 is provided with a circuit layer 520.

In one embodiment, there may be a single dielectric layer 100 to implement the embedded packaging of a single layer of electronic elements 300, or there may be a plurality of dielectric layers 100 to implement the embedded packaging of stacked electronic elements 300. The surface of each dielectric layer 400 is provided with the circuit layer 520, the circuit layers 520 of all the dielectric layers 100 communicate with one another via the through holes 400, and ultimately the shielding layers 510 and the circuit layers 520 are formed on the upper surface or the lower surface and the surrounding surface of the outermost dielectric layer 100, achieving the functions of shielding, dissipating heat and leading out electrical interfaces.

One embodiment of the present application provides a heat dissipation-electromagnetic shielding embedded packaging structure. The shielding layer 510 covering the exposed end of the electronic element 300 may also communicate with the shielding layer 510 covering the surface of the dielectric layer 100 via a through hole.

Figure 10:
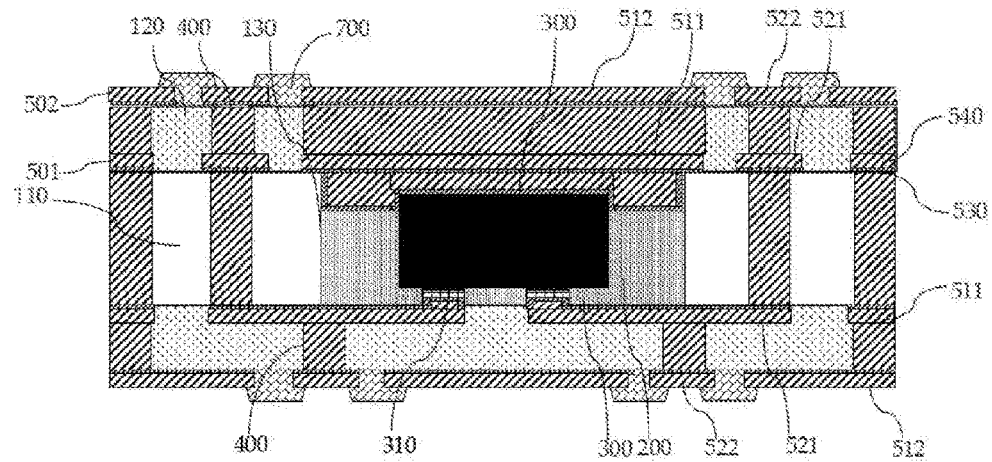
FIG. 10 is a sectional view of a heat dissipation-electromagnetic shielding embedded packaging structure provided by another embodiment of the present application.
Figure 13:
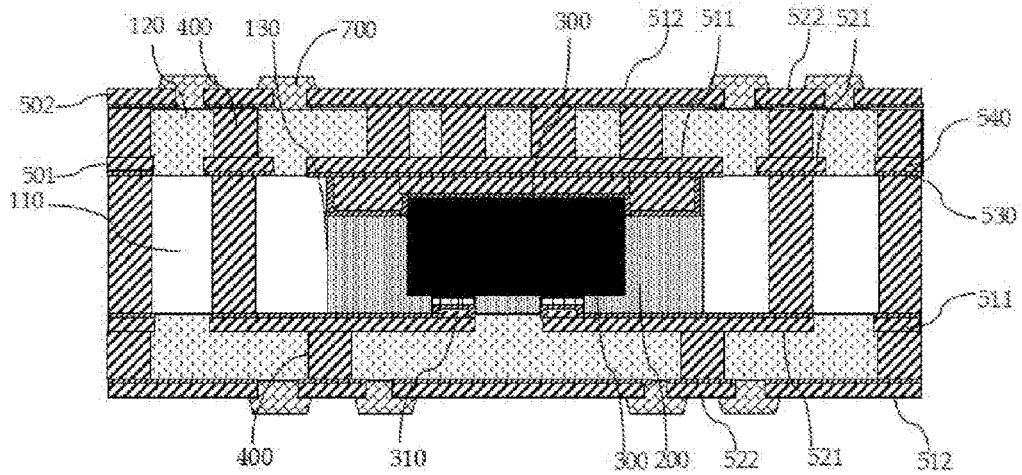
FIG. 13 is a sectional view of a heat dissipation-electromagnetic shielding embedded packaging structure provided by another embodiment of the present application.

Referring to FIG. 10 and FIG. 13, in one embodiment, the shielding layer 510 covering the exposed end of the electronic element 300 and the shielding layer 510 covering the surface of the dielectric layer 100 may be a whole metal layer 500, or the dielectric layer 100 may be filled for spacing between the metal layer 500, so that a metal through hole 400 is formed for communication between the metal layer 500 that are originally connected together, which can also achieve the functions of shielding and heat dissipation. Moreover, stress damage caused by different thermal expansion coefficients of the surfaces of the metal and the electronic element 300 can also be reduced by filling the spacing dielectric layer 100.

Referring to FIGS. 6-13, one embodiment of the present application provides a heat dissipation-electromagnetic shielding embedded packaging structure. The metal layer 500 includes a seed layer 530 and a covering layer 540, and the seed layer 530 is disposed at the bottom of the covering layer 540.

In one embodiment, the metal layer 500 is composed of a relatively thin seed layer 530 and a relatively thick covering layer 540, the seed layer 530 is disposed at the bottom of the covering layer 540, so that the seed layer 530 can provide a good coverage foundation for the covering layer 540 to improve the quality of the covering layer 540. The seed layer 530 may be made of, but is not limited to, a metal material such as titanium, copper or titanium-tungsten alloy, and the covering layer 540 may be made of, but is not limited to, copper.

Referring to FIG. 1, one embodiment of the present application provides a heat dissipation-electromagnetic shielding embedded packaging structure. The insulating layer 200 is made of a liquid photosensitive dielectric material that can be cured at a high temperature.

In one embodiment, the insulating layer 200 is made of a liquid photosensitive dielectric material, which may be filled by dispensing, printing or other methods. The liquid photosensitive dielectric material has high-temperature curing property, the mounting position and exposed height of the electronic component 300 can be conveniently adjusted when the liquid photosensitive dielectric material in a liquid state, and after being adjusted, the electronic component 300 can be mounted more accurately by curing the liquid photosensitive dielectric material. The insulating layer 200 may be made of, but is not limited to, ink. In addition, the hollow cavity unit is pre-filled with the liquid photosensitive dielectric material without performing a lamination and thinning process after mounting, thus greatly shortening the production cycle and reducing the production cost, the usage of materials and environmental pollution.

Based on the above-mentioned heat dissipation-electromagnetic shielding embedded packaging structure, various embodiments of a manufacturing method of the heat dissipation-electromagnetic shielding embedded packaging structure of the present application are proposed.

Referring to FIG. 2, another embodiment of the present application further provides a flowchart of a manufacturing method of a heat dissipation-electromagnetic shielding embedded packaging structure. The method includes, but not is limited to:

At a step of S100, providing a first dielectric layer 110 having a through hole 400 and a hollow cavity unit 310, wherein a metal layer 500 covers the surrounding surface of the first dielectric layer 110 and the interior of the through hole 400;

As shown in FIG. 3, an organic frame is produced by using the first dielectric layer 110, the frame includes at least one through hole 400 and at least one hollow cavity unit 130 inside, the volume and number of the hollow cavity unit 130 are set based on the size and the design requirements of the electronic element 300 to be embedded, and the number and position of the through hole 400 may be set according to the position and heat output of the electronic element.

At a step of S200, disposing an insulating layer 200 in the hollow cavity unit 130, mounting an electronic element 300 to the bottom of the insulating layer 200, and curing and photoetching the insulating layer 200 to expose terminals 310 of the electronic element 300, wherein the upper end of the electronic element 300 is exposed out of the insulating layer 200;

Step S200 is further detailed to include, but is not limited to:

At a step of S210, laminating an adhesive tape 600 on the lower surface of the first dielectric layer 110;

At a step of S220, filling a fixed amount of photosensitive liquid dielectric material into the hollow cavity unit 130 to form the insulating layer 200;

At a step of S230, mounting the electronic element 300 to the bottom of the insulating layer 200;

At a step of S240, pre-curing the insulating layer 200;

At a step of S250, removing the adhesive tape 600; and

At a step of S260, curing the insulating layer 200 at a high temperature and photoetching the insulating layer to expose the terminals 310 of the electronic element 300.

Figure 4:
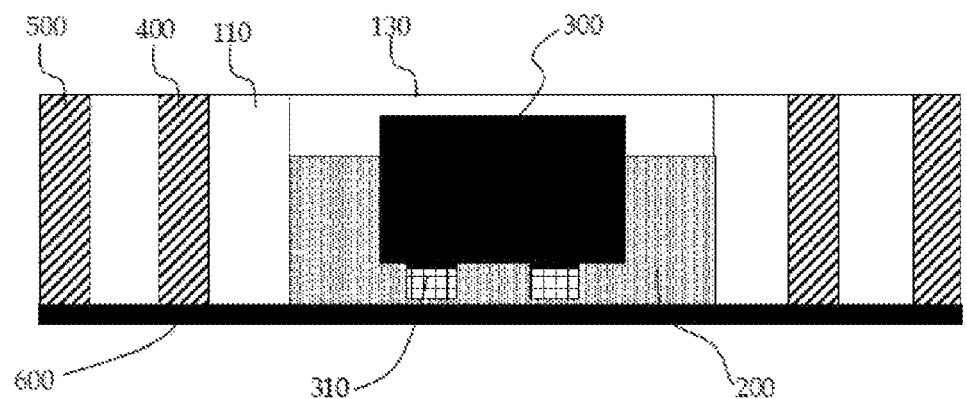
FIG. 4 and FIG. 5 are sectional views corresponding to step S200 in the manufacturing method of the heat dissipation-electromagnetic shielding embedded packaging structure provided by the other embodiment of the present application.
Figure 5:
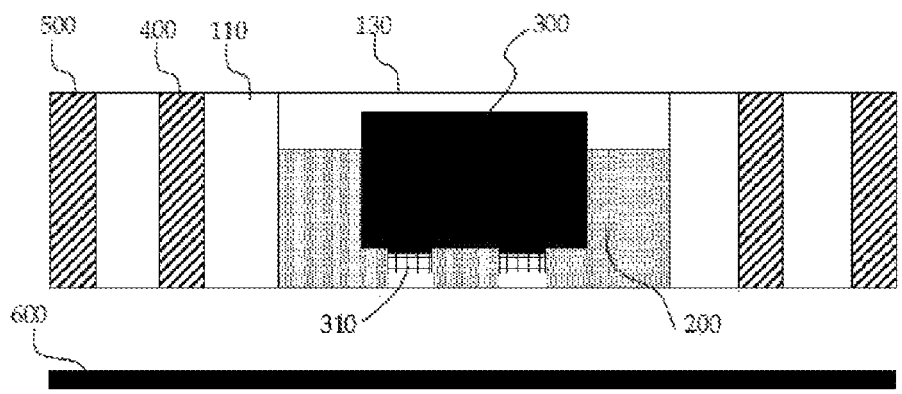

As shown in FIG. 4 and FIG. 5, in FIG. 4, the adhesive tape 600 is laminated on the lower surface of the first dielectric layer 110 to seal the bottom of the hollow cavity unit 130, and the insulating layer 200 composed of the liquid photosensitive dielectric material is filled. The filling of the liquid material is conducive to controlling the filled amount and the filled height of the insulating layer 200, and facilitates the mounting of the electronic element 300. In addition, since the lamination and thinning process does not need to be performed after the electronic element 300 is mounted, the production cycle is greatly shortened, and the production cost is reduced. Finally, the electronic element 300 is mounted to the bottom of the insulating layer 200, with the terminals 310 of the electronic element 300 facing downward and being close to the lower surface of the first dielectric layer 110, and the top of the electronic element 300 is higher than the insulating layer 200, so that the electronic element can be conveniently connected to the metal layer 500 later for heat dissipation and shielding. In FIG. 5, the filled insulating layer 200 is pre-cured in order to solidify the liquid insulating layer 200, so that the adhesive tape 600 can be conveniently removed, and the pre-curing temperature does not cause damage to the adhesive tape 600. After the adhesive tape 600 is removed, the insulating layer 200 is cured at a high temperature, and the surface of the cured insulating layer 200 is photoetched to expose the terminals 310 of the power supply element.

It should be noted that the adhesive tape 600 plays a bearing role, the adhesive tape 600 does not need to be cured at a high temperature, the requirement for high performance of the bearing adhesive tape 600 is decreased, and therefore the production cost is reduced. Moreover, since the bearing adhesive tape 600 does not need to undergo high-temperature treatment, the bearing adhesive tape 600 can be repeatedly used many times. Different from the fact that the direct contact and high-temperature curing of the electronic element 300 and the bearing adhesive tape 600 often leads to a certain proportion of rejection as a result of adhesive remaining on the surface of the electronic element 300 when the adhesive tape 600 is removed, the method does not require direct contact with the adhesive tape 600 during high-temperature curing, thus eliminating the risk of adhesive remaining on the electronic element 300 and increasing the yield of products.

Figure 6:
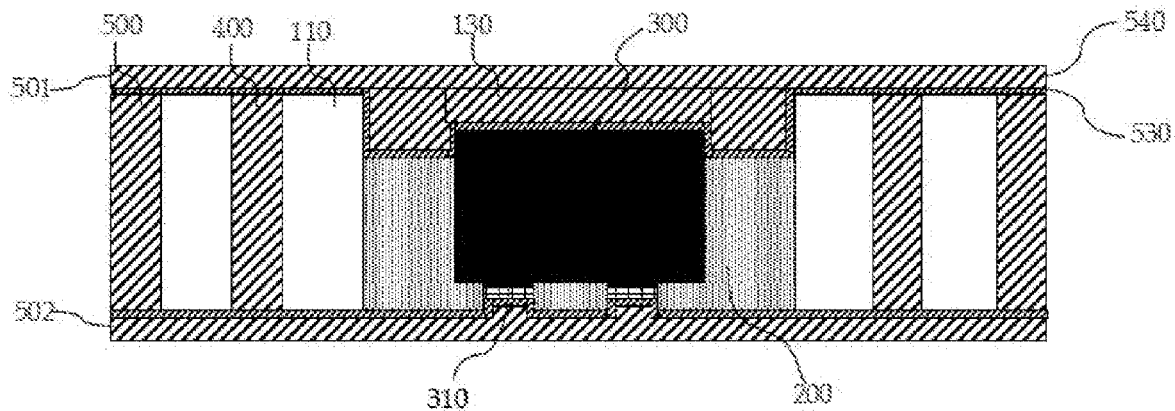
FIG. 6 and FIG. 7 are sectional views corresponding to step S300 in the manufacturing method of the heat dissipation-electromagnetic shielding embedded packaging structure provided by the other embodiment of the present application.

At a step of S300, forming a first metal layer 501 on the upper surface and the lower surface of the first dielectric layer 110, and photoetching the first metal layer 501 to form a first circuit layer 521 and a first shielding layer 511, wherein the first circuit layer 521 communicates with the terminals 310 and the through hole 400, and the first shielding layer 511 communicates with the metal layer 500 on the surrounding surface of the first dielectric layer 110;

As shown in FIG. 6, in one embodiment, the step of forming the first metal layer 501 includes:

forming a seed layer 530 on the upper surface of the first dielectric layer 110, wherein the seed layer 530 is made of a metal and/or metal alloy material; and forming a covering layer 540 on the surface of the seed layer 530, wherein the covering layer 540 is made of a metal material with a certain thickness.

As shown in FIG. 6, a thin metal seed layer 530 is formed on the entire upper surface and lower the surface of the first dielectric layer 110 on the basis of step S200 by electroless copper plating or sputtering. The commonly used metal of the seed layer 530 is but not limited to titanium, copper or titanium-tungsten alloy. Further, the metal covering layer 540 is electroplated on the metal seed layer 530, and in view of the good electrical and thermal conductivity of metal, copper is selected for electroplating. The purpose of forming a certain thickness of copper in the hollow cavity unit 130 and on the whole metal seed layer 530 by the hole-filling electroplating process is to metallize the back surface of the electronic element 300 and the sidewall above the insulating layer 200 and connect the electronic element 300 with the metal layer 500 on the surrounding surface, so that heat can be better conducted to the outer surface of a package, thus effectively reducing the working temperature of the device.

In some embodiments of the present application, the seed layer 530 can provide a good coverage foundation for the covering layer 540 to improve the quality of the covering layer 540. Therefore, In one embodiment of the present application, preferably, the seed layer 530 has a thickness of 1,000 nanometers, the covering layer 540 has a thickness of 8,000 nanometers, the thicknesses of the seed layer 530 and the covering layer 540 are relatively designed, as long as the designed specific thickness parameter values meet the actual process and design requirements, and shall all fall within the protection scope of the present application.

Figure 7:
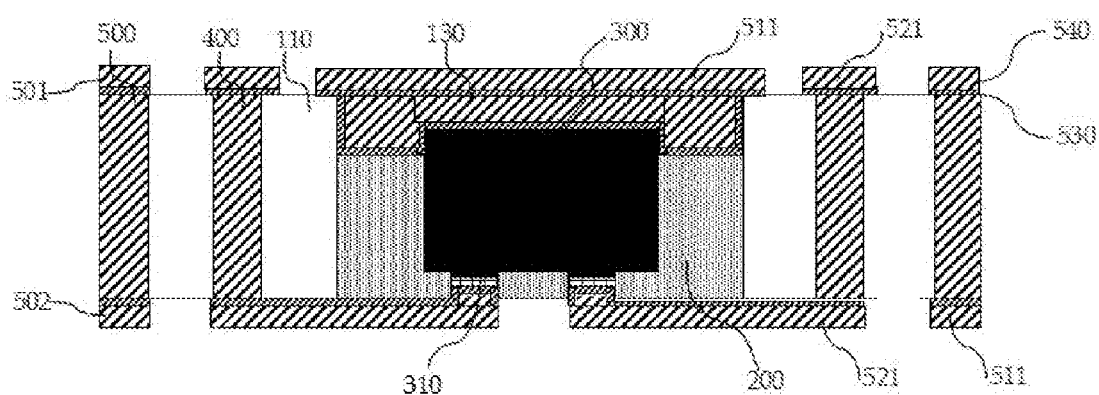

As shown in FIG. 7, the first metal layer 501 is photoetched to form the first circuit layer 521 and the first shielding layer 511; a photoresist or photosensitive dry film is attached to the surface of the first metal layer 501, and the photoresist or photosensitive dry film is exposed and developed to form a circuit pattern; the covering layer 540 and the seed layer 530 of the corresponding part of the pattern are removed by etching to form the first circuit layer 521 and the first shielding layer 511; the first circuit layer communicates with the terminals 310 of the electronic element and is located on the two end surfaces of the first dielectric layer 110, so that the electrical pins of the electronic element 300 can be led out, facilitating the subsequent electrical connection or testing of the electronic element 300; and the first shielding layer 511 directly communicates with the metal layer 500 on the surrounding surface of the first dielectric layer to prevent electromagnetic interference and dissipate heat. Finally, the photoresist or photosensitive dry film is removed by film stripping.

Figure 8:
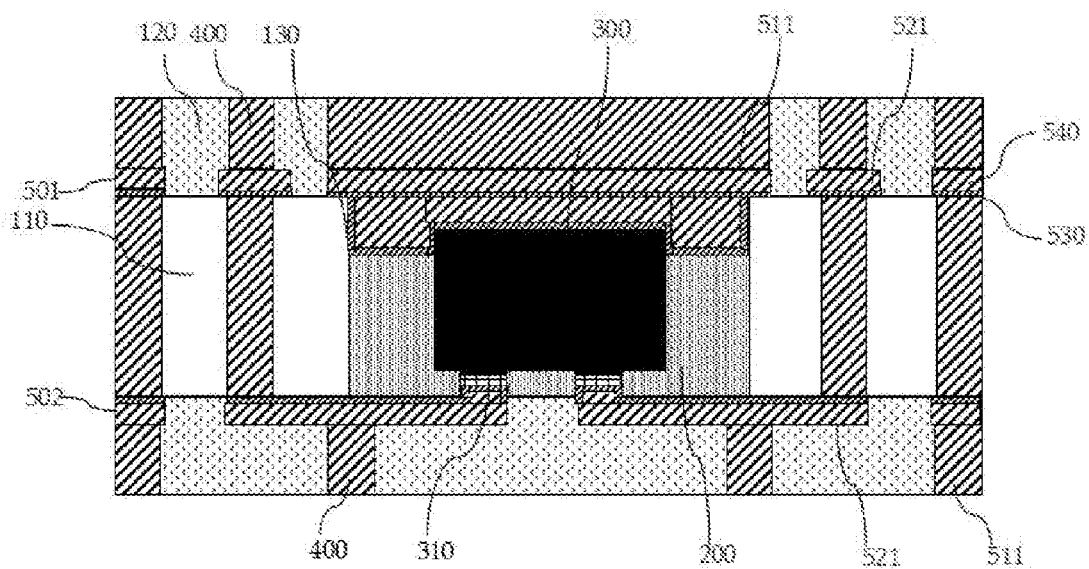
FIG. 8 and FIG. 9 are sectional views corresponding to intermediate states of the manufacturing method of the heat dissipation-electromagnetic shielding embedded packaging structure provided by the other embodiment of the present application.
Figure 9:
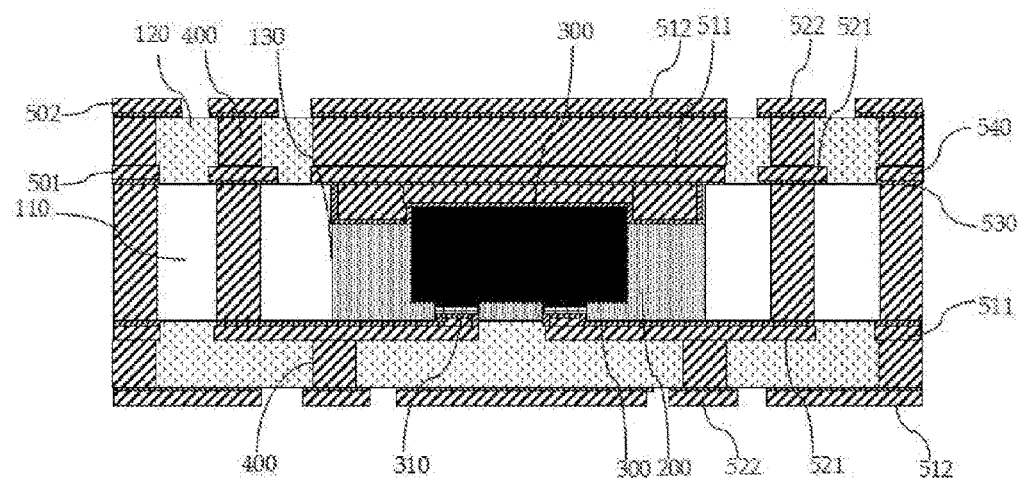

Referring to FIGS. 8 to 10, a manufacturing method of a heat dissipation-electromagnetic shielding embedded packaging structure provided by another embodiment of the present application may further include:

forming a second dielectric layer 120 on the surface of the first metal layer 501, and performing photoetching and electroplating on the second dielectric layer 120 to form a second metal layer 502.

In FIG. 8, the second dielectric layer 120 based on step S300 includes an upper and a lower part. A photoresist or photosensitive dry film is attached to the outer surfaces of the upper part and lower part of the second dielectric layer 120, and the photoresist or photosensitive dry film is photoetched to form a metal through hole 400. Then, electroplating is performed to form a metal pillar and a metal layer 500 on the surrounding surface. The material of the second dielectric layer 120 is first pressed to ensure more steady connection, and the material of the second dielectric layer 120 is then thinned by adopting plasma etching, polishing or other processes to expose the upper and lower surfaces of the metal pillars and the upper surface and the lower surface of the dielectric material.

In FIG. 9, second metal layers 502 are formed on the surrounding surface and the upper surface and the lower surface of the material of the second dielectric layer 120 by electroless plating or physical sputtering, with the second metal layer 502 including a metal seed layer 530 and a covering layer 540. Further, the second metal layer 502 is photoetched by pattern electroplating or negative etching to form a second circuit layer 522 and a second shielding layer 512. The first circuit layer 521 and the second circuit layer 522 communicate with the through hole 400, and the first shielding layer 511 and the second shielding layer 512 communicate with the metal layer on the surrounding surface of the first dielectric layer 110.

As shown in FIG. 10, a solder mask material is coated or pressed on both sides of the outer layer. The solder mask material is a non-conductive dielectric material, and a specific solder mask window 700 is formed in the solder mask material by exposure and development. The circuit layer 520 communicates with the electronic element 300, and the circuit layer 520 is isolated from the shielding layer 510 through the solder mask window 700, so that the electrical pins of the internal electronic device can be electrically isolated from the shielding layer on the surrounding surface for the arrangement and testing of the internal electronic device.

Referring to FIG. 14, in one embodiment of the present application, a multilayer packaging structure may also be provided. That is, an (N+1)th dielectric layer 100 is formed on the surface of the Nth metal layer 500, and photoetching and electroplating are performed on the (N+1)th dielectric layer 100 to form an (N+1)th metal layer 500; and the (N+1)th metal layer 500 is photoetched to form an (N+1)th circuit layer 520 and an (N+1)th shielding layer 510, the first circuit layer 521, . . . and the (N+1)th circuit layer 520 communicate with the through hole 400, and the first shielding layer 511, . . . and the (N+1)th shielding layer 510 communicate with the metal layer on the surrounding surface of the dielectric layer 100, wherein N≥1. The number of the layers of the heat dissipation-electromagnetic shielding embedded packaging structure of the present application may be set as multiple layers according to the requirement for the number of layout and wiring layers, wherein the internal circuit layers 520 ultimately communicate with the surface of the outermost dielectric layer 100 via the inner through hole 400, and the shielding layer 510 communicates with the inner through hole 400 via the metal layer 500 on the surrounding surface of each dielectric layer 100.

Referring to FIGS. 8 to 13, another embodiment of the present application provides a manufacturing method of a heat dissipation-electromagnetic shielding embedded packaging structure. The first shielding layer 511 and the second shielding layer 512 communicate with the metal layers on the surrounding surface of the first dielectric layer 110, wherein the first shielding layer 511 communicates with the second shielding layer 512 in at least one of the following ways:

the corresponding second dielectric layer 120 located on the upper surface of the hollow cavity unit 130 is completely etched away, so that the first shielding layer 511 is seamlessly connected with the second shielding layer 512, as shown in FIGS. 8-10 described in the above-mentioned embodiment.

In one embodiment, the first shielding layer 511 may also communicate with the second shielding layer 512 in the following way: the corresponding second dielectric layer 120 located on the upper surface of the hollow cavity unit 130 is partially etched away, so as to fill the first shielding layer 511 and the second shielding layer 512 in the second dielectric layer 120.

Figure 11:
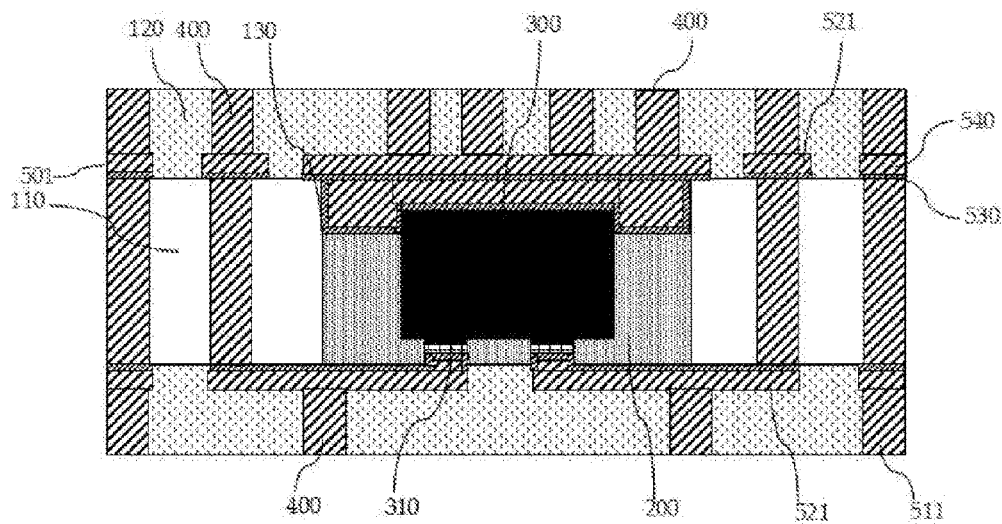
FIG. 11 and FIG. 12 are sectional views corresponding to intermediate states of the manufacturing method of the heat dissipation-electromagnetic shielding embedded packaging structure provided by the other embodiment of the present application.

As shown in FIG. 11, photoresist or photosensitive dry films are attached to the upper surface and the lower surface of the second dielectric layer 120 based on step S300, and the photoresist or photosensitive dry films are photoetched to form metal through holes 400, which include not only the metal through hole 400 connected to the circuit layer 520 but also the metal through hole 400 of the metal layer 500 located on the upper surface of the hollow cavity unit 130. Electroplating is then performed to form metal pillars and metal layers 500 on the surrounding surface. The material of the second dielectric layer 120 is laminated and thinned by plasma etching, polishing or other processes to expose the upper surface or the lower surface of the metal through holes 400 and the upper surface and the lower surface of the second dielectric layer 120.

Figure 12:
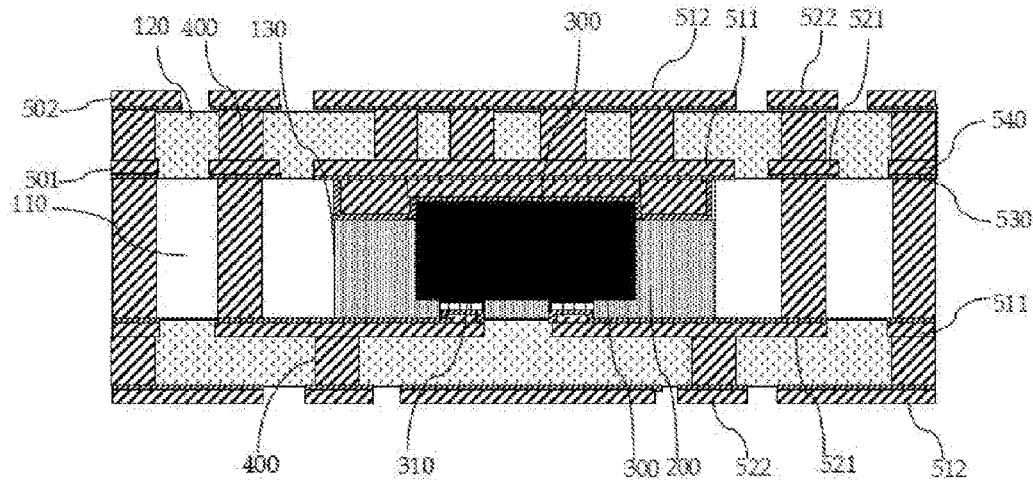

As shown in FIG. 12, a second metal layer 502 is formed on the surface of the material of the second dielectric layer 120 by electroless plating or physical sputtering, including a metal seed layer 530 and a covering layer 540, and a second circuit layer 522 and a second shielding layer 512 are further formed by pattern electroplating or negative etching.

It should be noted that the second shielding layer 512 located on the upper surface of the hollow cavity unit 130 communicates with the first shielding layer 511 in the vertical direction by filling the through hole 400 with a metal, and the communication relationship in which the metal through hole 400 and the medium are spaced apart is helpful for the uniform diffusion of the surface stress of the electronic element 300, so that the overall stress effect of the packaging structure is improved.

As shown in FIG. 13, a solder mask material is coated or laminated on both sides of the outer layer. The solder mask material is a non-conductive dielectric material, and a specific solder mask window 700 is formed in the solder mask material by exposure and development. The circuit layer 520 communicates with the electronic element 300, and the circuit layer 520 is isolated from the shielding layer 510 by the solder mask window 700, so that the electrical isolation between the electrical pins of the internal electronic device and the shielding layers on the surrounding surface can be achieved for the arrangement and testing of the internal electronic device.

Another embodiment of the present application further provides a substrate, including the heat dissipation-electromagnetic shielding embedded packaging structure in any one of the foregoing embodiments.

The preferred embodiments of the present application have been illustrated above in detail, but the present application is not limited to the above-mentioned embodiments. Those skilled in the art can also make various equivalent modifications or substitutions without departing from the spirit of the present application, and these equivalent modifications or substitutions shall all be included in the scope defined by the claims of the present application.

What is claimed is:

1. A heat dissipation-electromagnetic shielding embedded packaging structure, comprising:

dielectric layers, each of the dielectric layers comprises an upper surface and a lower surface, wherein at least one hollow cavity unit is disposed inside the dielectric layer, wherein the number of the dielectric layers is N+1;

an insulating layer, disposed in the hollow cavity unit, wherein the hollow cavity unit is partially filled with the insulating layer;

an electronic element, wherein one end is embedded in the insulating layer, the other end is exposed in the hollow cavity unit, and the electronic element comprises terminals;

a through hole, penetrating through the upper surface and the lower surface of the dielectric layer and communicating with the terminals; and metal layers, the number of the metal layers is N+1 and each of the metal layers covers the six surfaces of the dielectric layer and the interior of the through hole to form a shielding layer and a circuit layer respectively, wherein the shielding layer covers the exposed end of the electronic element, and the shielding layer and the circuit layer are isolated by the dielectric layer;

wherein the circuit layer communicates with the electronic element, the circuit layer is isolated from the shielding layer by a solder mask window, the through hole extends to the circuit layers on the upper surface and the lower surface of the dielectric layer; wherein the solder mask window is formed in a solder mask material by exposure and development, and the solder mask material is a non-conductive dielectric material;

wherein the terminals of the electronic element and the shielding layers are electrically isolated;

wherein the terminals of the electronic element are facing downward and connected to the circuit layers on the lower surface, the top of the electronic element is higher than the insulating layer and is connected to the metal layer;

wherein an (N+1)th dielectric layer is formed on the surface of an Nth metal layer, and an (N+1)th metal layer is formed through performing photoetching and electroplating on the (N+1)th dielectric layer;

wherein N≥1.

2. The heat dissipation-electromagnetic shielding embedded packaging structure of claim 1, wherein the shielding layer covering the exposed end of the electronic element can also communicate with the shielding layer covering the surface of the dielectric layer via a through hole.

3. The heat dissipation-electromagnetic shielding embedded packaging structure of claim 1, wherein the metal layer comprises a seed layer and a covering layer, and the seed layer is disposed at the bottom of the covering layer.

4. The heat dissipation-electromagnetic shielding embedded packaging structure of claim 1, wherein the insulating layer is made of a liquid photosensitive dielectric material, which can be cured at a high temperature.

5. A substrate, comprising the heat dissipation-electromagnetic shielding embedded packaging structure of claim 1, wherein the heat dissipation-electromagnetic shielding embedded packaging structure comprises:

dielectric layers, each of the dielectric layers comprises an upper surface and a lower surface, wherein at least one hollow cavity unit is disposed inside the dielectric layer, wherein the number of the dielectric layers is N+1;

an insulating layer, disposed in the hollow cavity unit, wherein the hollow cavity unit is partially filled with the insulating layer;

an electronic element, wherein one end is embedded in the insulating layer, the other end is exposed in the hollow cavity unit, and the electronic element comprises terminals;

a through hole, penetrating through the upper surface and the lower surface of the dielectric layer and communicating with the terminals; and metal layers, the number of the metal layers is N+1, and each of the metal layers covers the six surfaces of the dielectric layer and the interior of the through hole to form a shielding layer and a circuit layer respectively, wherein the shielding layer covers the exposed end of the electronic element, and the shielding layer and the circuit layer are isolated by the dielectric layer;

wherein the circuit layer communicates with the electronic element, the circuit layer is isolated from the shielding layer by a solder mask window, the through hole extends to the circuit layers on the upper surface and the lower surface of the dielectric layer; wherein the solder mask window is formed in a solder mask material by exposure and development, and the solder mask material is a non-conductive dielectric material; wherein the terminals of the electronic element and the shielding layers are electrically isolated;

wherein the terminals of the electronic element are facing downward and connected to the circuit layers on the lower surface, the top of the electronic element is higher than the insulating layer and is connected to the metal layer;

wherein an (N+1)th dielectric layer is formed on the surface of an Nth metal layer, and an (N+1)th metal layer is formed through performing photoetching and electroplating on the (N+1)th dielectric layer;

wherein N≥1.

6. A manufacturing method of a heat dissipation-electromagnetic shielding embedded packaging structure, comprising:

providing a first dielectric layer having a through hole and a hollow cavity unit, wherein a metal layer covers the surrounding surface of the first dielectric layer and the interior of the through hole;

disposing an insulating layer in the hollow cavity unit, mounting an electronic element to a bottom of the insulating layer, and curing and photoetching the insulating layer to expose terminals of the electronic element, wherein the upper end of the electronic element is exposed out of the insulating layer; and forming a first metal layer on an upper surface and a lower surface of the first dielectric layer, and photoetching the first metal layer to form a first circuit layer and a first shielding layer, wherein the first circuit layer communicates with the terminals and the through hole; and the first shielding layer communicates with the metal layer on the surrounding surface of the first dielectric layer;

wherein the step of disposing the insulating layer in the hollow cavity unit, mounting the electronic element to the bottom of the insulating layer, and curing and photoetching the insulating layer to expose terminals of the electronic element comprises:

laminating an adhesive tape on the lower surface of the first dielectric layer;

filling a fixed amount of photosensitive liquid dielectric material into the hollow cavity unit to form the insulating layer;

mounting the electronic element to the bottom of the insulating layer;

pre-curing the insulating layer;

removing the adhesive tape without being cured at a high temperature such that the adhesive tape can be repeatedly used; and curing the insulating layer at a high temperature and photoetching the insulating layer to expose the terminals of the electronic element; wherein the terminals of the electronic element are facing downward and connected to the circuit layers on the lower surface, the top of the electronic element is higher than the insulating layer.

7. The manufacturing method of claim 6, wherein the step of forming the first metal layer comprises:

forming a seed layer on the upper surface of the first dielectric layer, wherein the seed layer is made of a metal and/or metal alloy material; and forming a covering layer on the surface of the seed layer, wherein the covering layer is made of a metal material with a certain thickness.

8. The manufacturing method of claim 7, further comprising:

forming an (N+1)th dielectric layer on the surface of the Nth metal layer, and performing photoetching and electroplating on the (N+1)th dielectric layer to form an (N+1)th metal layer; and photoetching the (N+1)th metal layer to form an (N+1)th circuit layer and an (N+1)th shielding layer, wherein the first circuit layer, and the (N+1)th circuit layer communicate with the through hole, and the first shielding layer, and the (N+1)th shielding layer communicate with the metal layer on the surrounding surface of the dielectric layer, and N≥1.

9. The manufacturing method of claim 6, further comprising:
forming an (N+1)th dielectric layer on the surface of the Nth metal layer, and performing photoetching and electroplating on the (N+1)th dielectric layer to form an (N+1)th metal layer; and
photoetching the (N+1)th metal layer to form an (N+1)th circuit layer and an (N+1)th shielding layer, wherein the first circuit layer, and the (N+1)th circuit layer communicate with the through hole, and the first shielding layer, and the (N+1)th shielding layer communicate with the metal layer on the surrounding surface of the dielectric layer, and N≥1.

10. The manufacturing method of claim 9, wherein the first shielding layer and the (N+1)th shielding layer communicate with the metal layer on the surrounding surface of the dielectric layer, and the first shielding layer communicates with the (N+1)th shielding layer in at least one of the following ways:
completely etching away the corresponding (N+1)th dielectric layer located on the upper surface of the hollow cavity unit, and filling a metal so that the first shielding layer is seamlessly connected with the (N+1)th shielding layer through the metal; and
partially etching away the corresponding (N+1)th dielectric layer located on the upper surface of the hollow cavity unit to form a through hole window, and filling a metal so that the first shielding layer communicates with the (N+1)th shielding layer via a through hole.

* * * * *